United States Patent [19]
Kim et al.

[11] Patent Number: 5,602,506
[45] Date of Patent: Feb. 11, 1997

[54] BACK BIAS VOLTAGE GENERATOR

[75] Inventors: Tae-Hoon Kim; Young-Hyun Jun, both of Seoul, Rep. of Korea

[73] Assignee: Goldstar Electron Co., Ltd., Cheongju, Rep. of Korea

[21] Appl. No.: 362,299

[22] Filed: Dec. 22, 1994

[30] Foreign Application Priority Data

Apr. 13, 1994 [KR] Rep. of Korea ............. 7758/1994

[51] Int. Cl.$^6$ ............................................. G05F 1/10
[52] U.S. Cl. .................................. 327/535; 327/534
[58] Field of Search ............................ 327/534, 535, 327/536, 537

[56] References Cited

U.S. PATENT DOCUMENTS

| | | | |
|---|---|---|---|
| 4,471,290 | 9/1984 | Yamaguchi et al. | 327/535 |
| 4,794,278 | 12/1988 | Vajdic | 327/537 |
| 5,057,704 | 10/1991 | Koyanagi et al. | 327/534 |
| 5,113,088 | 5/1992 | Yamamoto et al. | 327/536 |
| 5,157,278 | 10/1992 | Min et al. | 327/534 |
| 5,191,235 | 3/1993 | Hara | 327/534 |
| 5,270,584 | 12/1993 | Koshikawa et al. | 327/534 |
| 5,329,168 | 7/1994 | Sugibayashi et al. | 327/535 |
| 5,394,026 | 2/1995 | Yu et al. | 327/536 |

*Primary Examiner*—Terry Cunningham
*Attorney, Agent, or Firm*—Fleshner & Kim

[57] ABSTRACT

A back bias voltage generator comprising a power-on signal generator for generating a power-on signal when an external voltage remains at a constant level, a reference voltage generator for generating a reference voltage in response to the power-on signal from the power-on signal generator, an internal voltage generator for generating an internal voltage and an internal/external voltage select signal in response to the reference voltage from the reference voltage generator, the internal voltage being constant in level, a back bias voltage sensor for generating an oscillation enable signal in response to the external voltage or the internal voltage from the internal voltage generator under control of the internal/ external voltage select signal from the internal voltage generator, an oscillator for generating an oscillating signal at a desired period and an enable signal in response to the oscillation enable signal from the back bias voltage sensor and outputting the generated enable signal to the internal voltage generator, and a back bias voltage pump for performing a voltage pumping operation in response to the oscillating signal from the oscillator to generate a desired level of back bias voltage and outputting the generated back bias voltage to an external circuit and the back bias voltage sensor.

7 Claims, 8 Drawing Sheets

VCC

PWRON

OSCEN

VBB

FIG.10
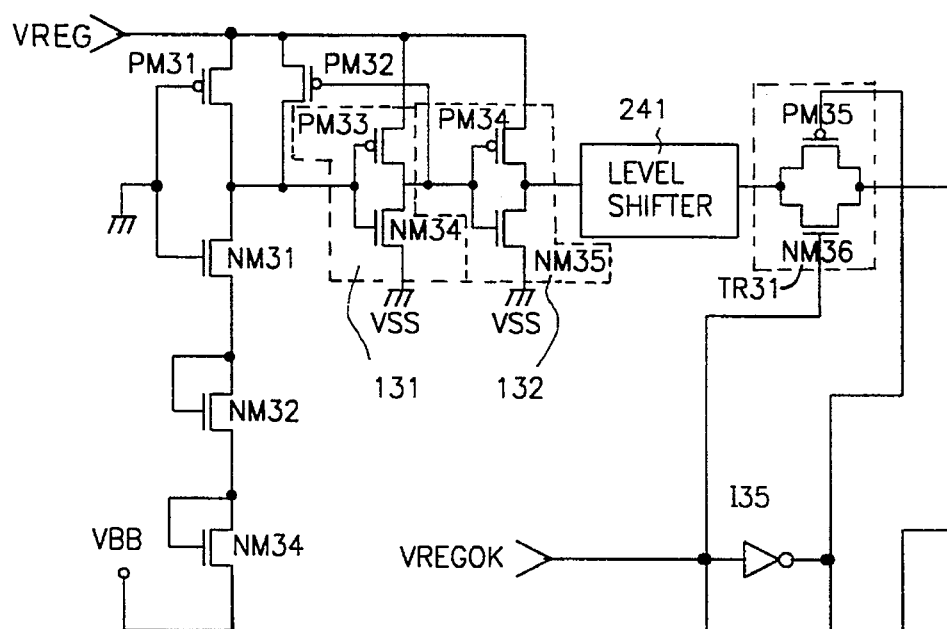
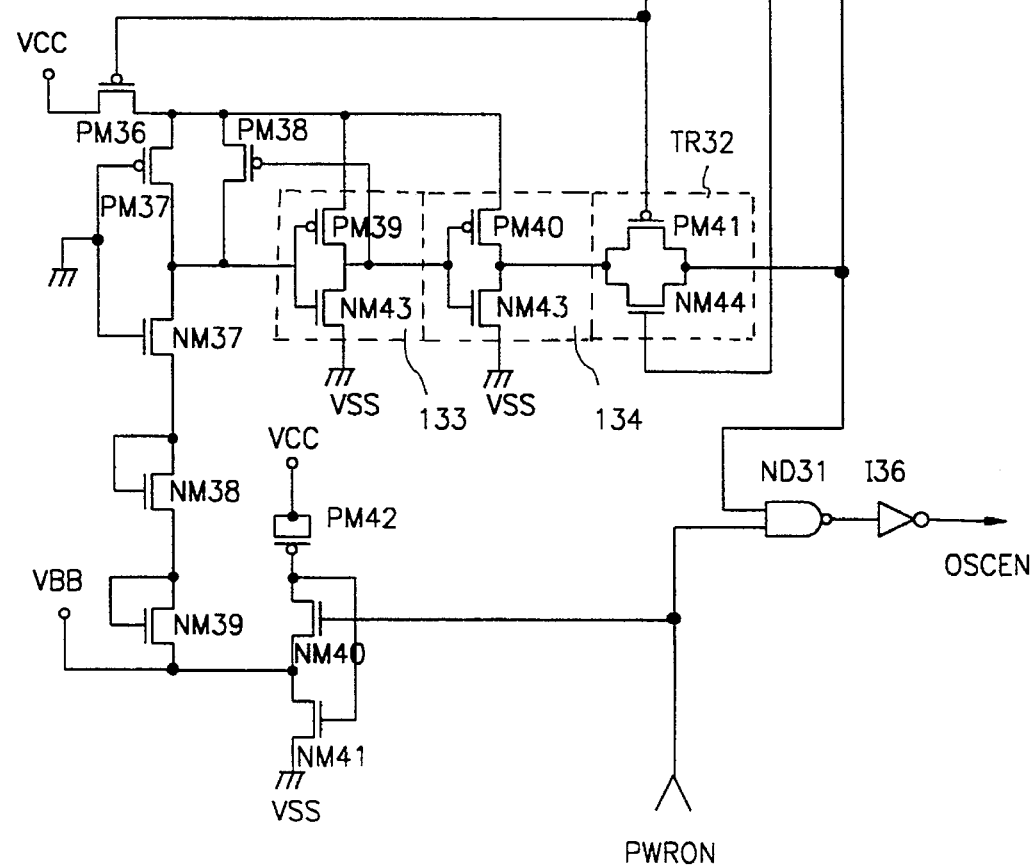

FIG.11A ACC

FIG.11B PWRON

FIG.11C OSCEN

FIG.11D VBB

FIG.11E VBBOKB

FIG.11F VREF

FIG.11G VREG

FIG.11H VREGOK

BACK BIAS VOLTAGE GENERATOR

BACKGROUND OF THE INVENTION

1. Field of the Invention

The present invention relates in general back bias voltage generators, and more particularly to a back bias voltage generator for generating a voltage independent of a variation in an external voltage and regulating a back bias voltage according to the generated voltage so that the back bias voltage can be constant in level regardless of the variation in the external voltage.

2. Description of the Prior Art

Referring to FIG. 1, there is shown a block diagram of a conventional back bias voltage generator. As shown in this drawing, the conventional back bias voltage generator comprises a power-on signal generator 1 for generating a power-on signal PWRON at a time point that an external voltage Vcc is stabilized, a back bias voltage sensor 2 for generating an oscillation enable signal OSCEN in response to the power-on signal PWRON from the power-on signal generator 1, an oscillator 3 for generating an oscillating signal at a desired period in response to the oscillation enable signal OSCEN from the back bias voltage sensor 2, and a back bias voltage pump 4 for performing a voltage pumping operation in response to the oscillating signal from the oscillator 3 to generate a desired level of back bias voltage VBB and outputting the generated back bias voltage VBB to an external circuit and the back bias voltage sensor 2.

Referring to FIG. 2, there is shown a detailed circuit diagram of the power-on signal generator 1 in FIG. 1. As shown in this drawing, the power-on signal generator 1 includes a PMOS transistor PM1 having a source for inputting the external voltage Vcc, a drain connected to a ground terminal Vss through an NMOS transistor NM1 and a gate connected directly to the ground terminal Vss. The NMOS transistor NM1 acts as a capacitor.

The power-on signal generator 1 also includes a PMOS transistor PM2 having a drain connected to a node between the PMOS transistor PM1 and the NMOS transistor NM1, and a gate and a source connected in common to the ground terminal Vss through an NMOS transistor NM2. The NMOS transistor NM2 acts as a capacitor.

Further, the power-on signal generator 1 includes an inverter I1 having an input terminal connected to a node between the PMOS transistor PM2 and the NMOS transistor NM2, and an inverter I2 having an input terminal connected to an output terminal of the inverter I1 and for inputting the external voltage Vcc through a PMOS transistor PM3 and an output terminal for outputting the power-on signal PWRON to the back bias voltage sensor 2. The PMOS transistor PM3 acts as a capacitor.

Referring to FIG. 3, there is shown a detailed circuit diagram of the back bias voltage sensor 2 in FIG. 1. As shown in this drawing, the back bias voltage sensor 2 includes PMOS transistors PM11 and PM12 having sources for inputting the external voltage Vcc in common and drains connected in common, respectively, an NMOS transistor NM11 having a drain connected to the drain of the PMOS transistor PM11, and NMOS transistors NM12 and NM13 connected in series to a source of the NMOS transistor NM11. The PMOS and NMOS transistors PM11 and NM11 have gates connected in common to the ground terminal Vss, respectively. The NMOS transistor NM12 has a gate and a drain connected in common to the source of the NMOS transistor NM11. The NMOS transistor NM13 has a gate and a drain connected in common to a source of the NMOS transistor NM12.

The back bias voltage sensor 2 also includes an inverter I11 having an input terminal connected in common to the drains of the PMOS transistors PM11 and PM12 and an output terminal connected to a gate of the PMOS transistor PM12, an inverter I12 having an input terminal connected to the gate of the PMOS transistor PM12 and the output terminal of the inverter I11, an NMOS transistor NM14 having a source for inputting the external voltage Vcc through a PMOS transistor PM13, and an NMOS transistor NM15 having a source connected to the ground terminal Vss, a gate for inputting the external voltage Vcc through the PMOS transistor PM13 and a drain connected in common to a drain of the NMOS transistor NM14 and a source of the NMOS transistor NM13 and for inputting the back bias voltage VBB from the back bias voltage pump 4. The PMOS transistor PM13 acts as a capacitor.

Further, the back bias voltage sensor 2 includes a NAND gate ND11 having one input terminal connected to an output terminal of the inverter I12 and the other input terminal connected to a gate of the NMOS transistor NM14 and for inputting the power-on signal PWRON from the power-on signal generator 1, and an inverter I13 having an input terminal connected to an output terminal of the NAND gate ND11 and an output terminal for outputting the oscillation enable signal OSCEN to the oscillator 3.

The operation of the conventional back bias voltage generator with the above-mentioned construction will hereinafter be described with reference to FIGS. 4A to 7. FIGS. 4A to 4D are timing diagrams illustrating the operation of the conventional back bias voltage generator in FIG. 1, FIG. 5 is a graph illustrating a relationship between the external voltage Vcc and the back bias voltage VBB in FIG. 1, FIG. 6 is a sectional view illustrating a construction of a general transistor and FIG. 7 is a graph illustrating a relationship between the external voltage Vcc and a voltage Vpp used in FIG. 6.

First, in the power-on signal generator 1, the external voltage Vcc is supplied to the source of the PMOS transistor PM1 and then set up to a constant level after the lapse of a predetermined time period as shown in FIG. 4A. The predetermined time period corresponds to an RC time constant which is determined by the PMOS transistor PM1 acting as a resistor and the NMOS transistor NM1 acting as the capacitor.

At the moment that the external voltage Vcc is set up to the constant level, the power-on signal PWRON which is applied from the power-on signal generator 1 to the back bias voltage sensor 2 goes high in logic as shown in FIG. 4B.

On the other hand, in the case where the power-on signal PWRON from the power-on signal generator 1 is low in logic, the back bias voltage sensor 2 is operated in the following manner. The low logic power-on signal PWRON from the power-on signal generator 1 is applied to the NAND gate ND11 and the gate of the NMOS transistor NM14. As a result, the NAND gate ND11 outputs a high logic signal to the inverter I13 regardless of the state of the external voltage Vcc, thereby causing the oscillation enable signal OSCEN which is outputted from the inverter I13 to the oscillator 3 to become low in logic. Also, the NMOS transistor NM14 is turned off. As a result, the external voltage Vcc through the PMOS transistor PM13 is not transferred to the NMOS transistor NM14 but to the gate of the NMOS transistor NM15, thereby causing the NMOS transistor NM15 to be turned on. In result, the back bias voltage VBB becomes a ground level Vss.

Subsequently, the oscillator 3 outputs no oscillating signal to the back bias voltage pump 4 in response to the low logic oscillation enable signal OSCEN from the back bias voltage sensor 2. As a result, the back bias voltage pump 4 remains at its stop state.

When the power-on signal PWRON from the power-on signal generator 1 goes high in logic under the condition that the oscillation enable signal OSCEN from the back bias voltage sensor 2 is low in logic, the NMOS transistor NM14 in the back bias voltage sensor 2 is turned on.

Then in the back bias voltage sensor 2, a voltage at a node A becomes the state of the back bias voltage VBB or the ground level Vss because of the turning-on of the NMOS transistor NM14. After being released from the ground level Vss, the back bias voltage VBB is supplied to the gate of the NMOS transistor NM15 through the NMOS transistor NM14.

At this time, because the NMOS transistors NM11–NM13 remain at their OFF states, the input terminal of the inverter I11 becomes high in logic and the output signal from the inverter I12 goes high in logic.

Upon receiving the high output signal from the inverter I12 and the high power-on signal PWRON from the power-on signal generator 1, the NAND gate ND11 outputs a low logic signal to the inverter I13. As a result, the oscillation enable signal OSCEN from the inverter I13 goes high in logic as shown in FIG. 4C. The high oscillation enable signal OSCEN from the inverter I13 is supplied to the oscillator 3.

The oscillator 3 generates the oscillating signal at the desired period in response to the high oscillation enable signal OSCEN from the back bias voltage sensor 2 and outputs the generated oscillating signal to the back bias voltage pump 4. Upon receiving the oscillating signal from the oscillator 3, the back bias voltage pump 4 performs a negative (−) pumping operation for the back bias voltage VBB, thereby causing the back bias voltage VBB to be gradually lowered in level as shown in FIG. 4D. Then, the bias voltage pump 4 outputs the resultant back bias voltage VBB to the external circuit and the back bias voltage sensor 2.

At the moment that the back bias voltage VBB is lowered to $-3V_T$, the NMOS transistors NM11–NM13 are turned on, thereby causing the input terminal of the inverter I11 to go low in logic and the output signal from the inverter I12 to become low in logic.

The NAND gate ND11 outputs a high logic signal to the inverter I13 because it inputs the low output signal from the inverter I12 and the high power-on signal PWRON from the power-on signal generator 1. As a result, the oscillation enable signal OSCEN from the inverter I13 goes low in logic as shown in FIG. 4C. The low oscillation enable signal OSCEN from the inverter I13 is supplied to the oscillator 3.

In response to the low oscillation enable signal OSCEN from the back bias voltage sensor 2, the oscillator 3 stops the generation of the oscillating signal. Because receiving no oscillating signal from the oscillator 3, the back bias voltage pump 4 stops the negative (−) pumping operation for the back bias voltage VBB, thereby causing the back bias voltage VBB to be constant in level. Then, the bias voltage pump 4 outputs the resultant back bias voltage VBB to the external circuit and the back bias voltage sensor 2.

By the way, in the conventional back bias voltage generator, the external voltage Vcc is directly supplied to the back bias voltage sensor 2. For this reason, an amount of current flowing through each of the PMOS transistors PM11 and PM12 is varied with a variation of the external voltage Vcc, resulting in a variation in trip voltages of the inverters I11 and I12 and the NAND gate ND11.

In result, the back bias voltage VBB is gradually lowered in level as the external voltage Vcc is increased in level, as shown in FIG. 5.

On the other hand, a memory device comprises generally circuits such as a word line driver, an output buffer and etc. using the voltage Vpp, which is higher than the external voltage Vcc. The circuits of the memory device include generally the transistor as shown in FIG. 6. As shown in FIG. 6, the transistor includes a P-type substrate to which the back bias voltage VBB is applied, and an $N^+$ diffusion region having a drain for inputting the voltage Vpp, a gate for inputting a control signal and a source connected to the ground terminal.

However, under the condition that the external voltage Vcc is high in level as shown in FIG. 7, a high electric field is applied to a junction of the transistor in FIG. 6 because the back bias voltage VBB is lowered in level whereas the voltage Vpp becomes higher in level, resulting in a degradation in the reliability of the transistor.

As mentioned above, in the conventional back bias voltage generator, the back bias voltage VBB is gradually lowered in level whereas the voltage Vpp becomes higher in level as the external voltage Vcc is increased in level. As a result, the high electric field is applied to the junction of the transistor, resulting in the degradation in the reliability of the transistor.

SUMMARY OF THE INVENTION

Therefore, the present invention has been made in view of the above problem, and it is an object of the present invention to provide a back bias voltage generator for generating a back bias voltage which is constant in level regardless of a variation in an external voltage.

In accordance with the present invention, the above and other objects can be accomplished by a provision of a back bias voltage generator comprising power-on signal generation means for generating a power-on signal when an external voltage remains at a constant level; reference voltage generation means for generating a reference voltage in response to the power-on signal from said power-on signal generation means; internal voltage generation means for generating an internal voltage and an internal/external voltage select signal in response to the reference voltage from said reference voltage generation means, said internal voltage being constant in level; back bias voltage sensing means for generating an oscillation enable signal in response to the external voltage or the internal voltage from said internal voltage generation means under control of the internal/external voltage select signal from said internal voltage generation means; oscillation means for generating an oscillating signal at a desired period and an enable signal in response to the oscillation enable signal from said back bias voltage sensing means and outputting the generated enable signal to said internal voltage generation means; and back bias voltage pumping means for performing a voltage pumping operation in response to the oscillating signal from said oscillation means to generate a desired level of back bias voltage and outputting the generated back bias voltage to an external circuit and said back bias voltage sensing means.

BRIEF DESCRIPTION OF THE DRAWINGS

The above and otter objects, features and advantages of the present invention till be more clearly understood from the following detailed description taken in conjunction with the accompanying drawings, in which:

FIG. 10 is a detailed circuit diagram of a back bias voltage sensor in FIG. 8;

DETAILED DESCRIPTION OF THE PREFERRED EMBODIMENTS

Figure 1:
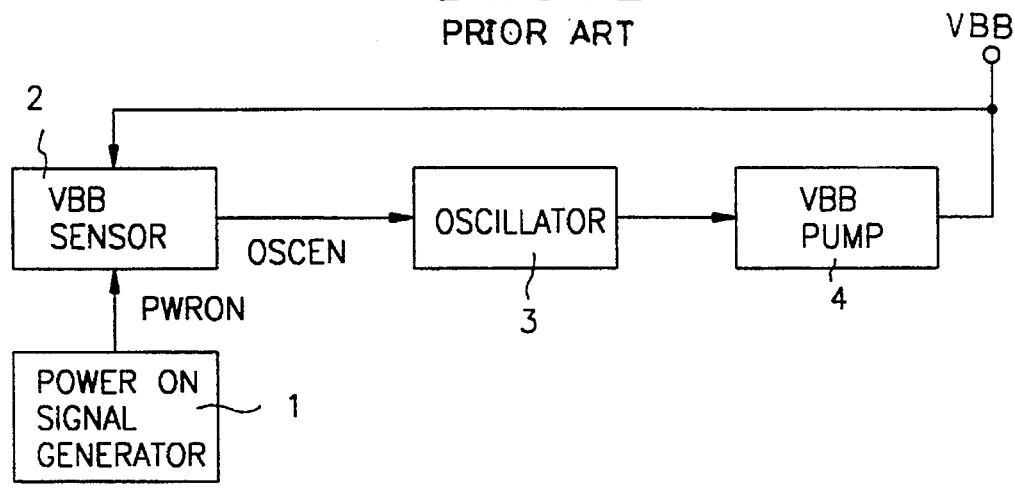
FIG. 1 is a block diagram of a conventional back bias voltage generator.
Figure 2:
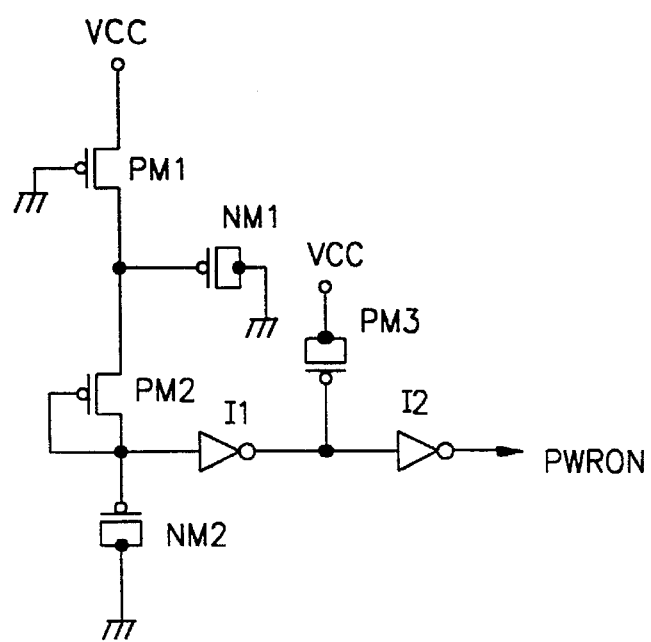
FIG. 2 is a detailed circuit diagram of a power-on signal generator in FIG. 1.
Figure 3:
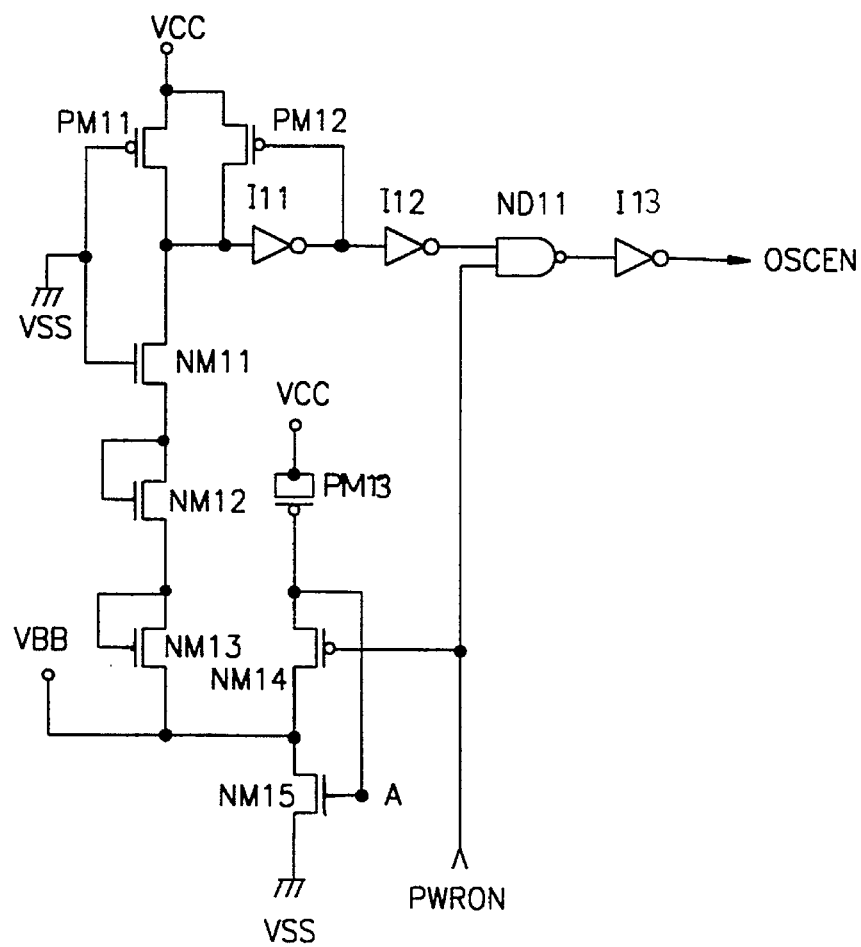
FIG. 3 is a detailed circuit diagram of a back bias voltage sensor in FIG. 1.
Figure 5:
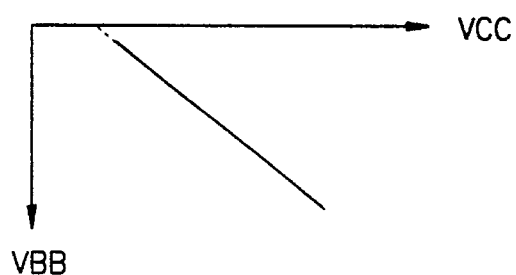
FIG. 5 is a graph illustrating a relationship between an external voltage and a back bias voltage in FIG. 1.
Figure 4A:
FIGS. 4A to 4D are timing diagrams illustrating an operation of the conventional back bias voltage generator in FIG. 1.
Figure 4B:
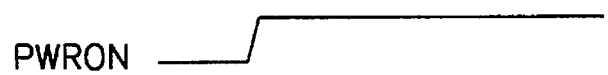
Figure 4C:
Figure 4D:
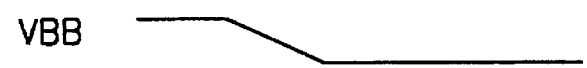
Figure 6:
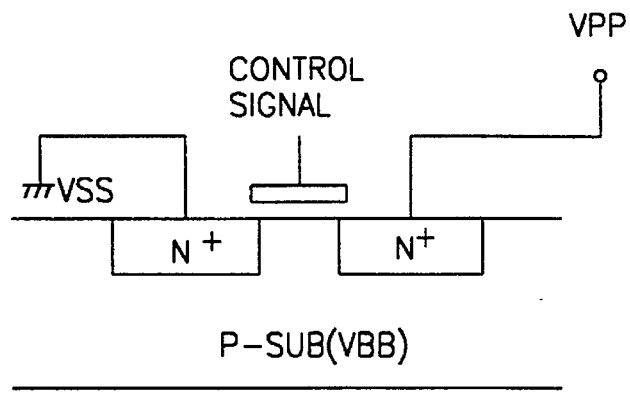
FIG. 6 is a sectional view illustrating a construction of a general transistor.
Figure 7:
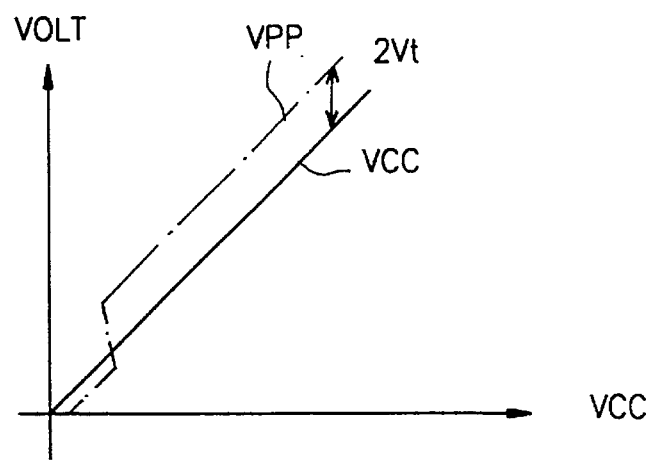
FIG. 7 is a graph illustrating a relationship between the external voltage and a voltage used in FIG. 6.
Figure 8:
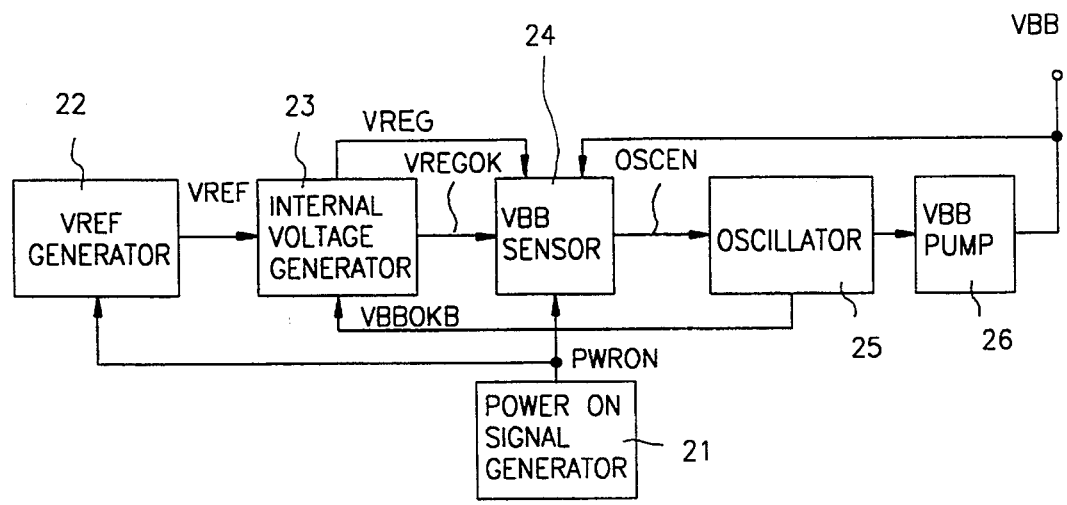
FIG. 8 is a block diagram of a back bias voltage generator in accordance with the present invention.

Referring to FIG. 8, there is shown a block diagram of a back bias voltage generator in accordance with the present invention. As shown in this drawing, the back bias voltage generator comprises a power-on signal generator 21 for generating a power-on signal PWRON at a time point that an external voltage Vcc remains at a constant level, a reference voltage generator 22 for generating a reference voltage VREF at a time point that it inputs the power-on signal PWRON from the power-on signal generator 21, and an internal voltage generator 23 for inputting the external voltage Vcc as a drive voltage thereto and outputting an internal voltage VREG and an internal/external voltage select signal VREGOK. The internal voltage generator 23 is adapted to compare the reference voltage VREF from the reference voltage generator 22 with a voltage obtained by dropping the internal voltage VREG using a resistance R and generate the internal voltage VREG and the internal/external voltage select signal VREGOK in accordance with the compared result.

The back bias voltage generator also comprises a back bias voltage sensor 24 for generating an oscillation enable signal OSCEN in response to the internal/external voltage select signal VREGOK from the internal voltage generator 23. Under control of the internal/external voltage select signal VREGOK from the internal voltage generator 23, the back bias voltage sensor 24 is adapted to generate the oscillation enable signal OSCEN according to the external voltage Vcc at an initial state that the external voltage Vcc is supplied. Then, under the control of the internal/external voltage select signal VREGOK from the internal voltage generator 23, the back bias voltage sensor 24 is adapted to generate the oscillation enable signal OSCEN according to the internal voltage VREG from the internal voltage generator 23 when the internal voltage VREG is stabilized at a constant level.

Further, the back bias voltage generator comprises an oscillator 25 for generating an oscillating signal at a desired period in response to the oscillation enable signal OSCEN from the back bias voltage sensor 24, and a back bias voltage pump 26 for performing a voltage pumping operation in response to the oscillating signal from the oscillator 25 to generate a desired level of back bias voltage VBB and outputting the generated back bias voltage VBB to an external circuit and the back bias voltage sensor 24. The oscillator 25 is also adapted to output an enable signal VBBOKB to the internal voltage generator 23 when the back bias voltage VBB from the back bias voltage pump 26 is stabilized at a constant level.

Figure 9:
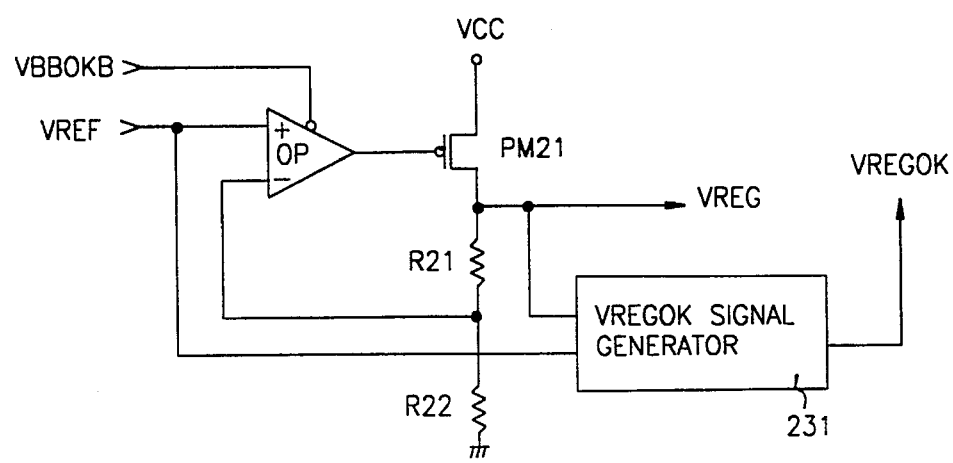
FIG. 9 is a detailed circuit diagram of an internal voltage generator in FIG. 8.
Figure 11:
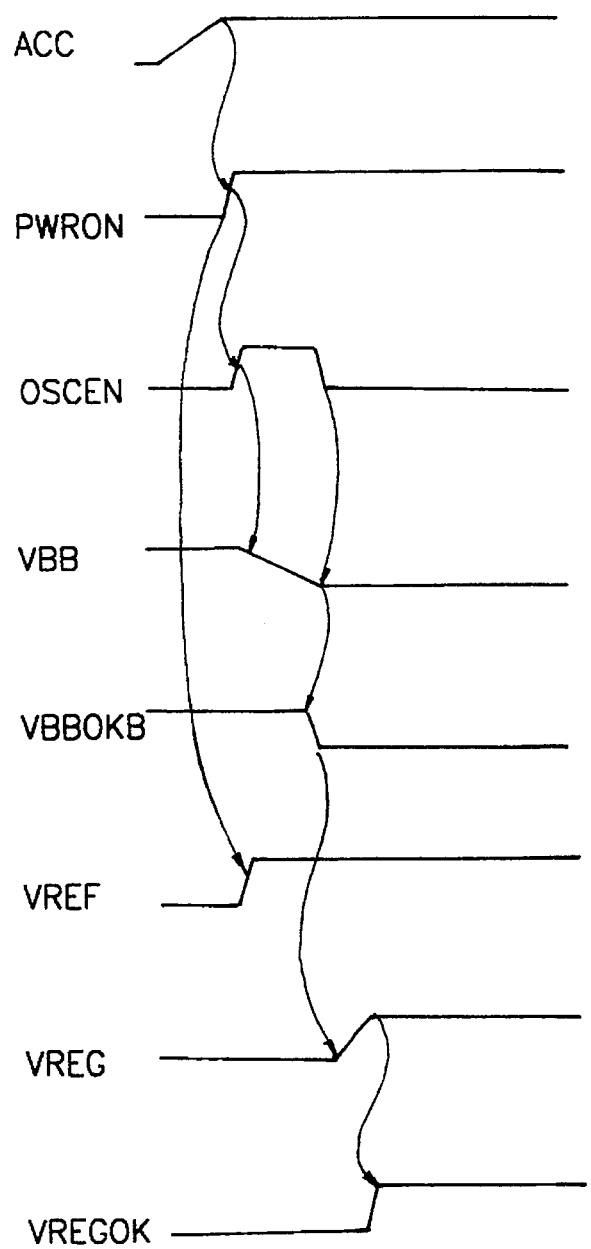
FIGS. 11A to 11H are timing diagrams illustrating an operation of the back bias voltage generator in FIG. 8.

Referring to FIG. 9, there is shown a detailed circuit diagram of the internal voltage generator 23 in FIG. 8. As shown in this drawing, the internal voltage generator 23 includes an operational amplifier OP for comparing the reference voltage VREF from the reference voltage generator 22 with the internal voltage VREG under control of the enable signal VBBOKB from the oscillator 25. The operational amplifier OP has a non-inverting input terminal (+) for inputting the reference voltage VREF from the reference voltage generator 22.

The internal voltage generator 23 also includes a PMOS transistor PM21 for outputting the internal voltage VREG. The PMOS transistor PM21 has a gate connected to an output terminal of the operational amplifier OP, a source for inputting the external voltage Vcc and a drain connected to a ground terminal Vss through resistors R21 and R22. A node between the resistors R21 and R22 is connected to an inverting input terminal (−) of the operational amplifier OP.

Further, the internal voltage generator 23 includes an internal/external voltage select signal generator 231 for inputting the reference voltage VREF from the reference voltage generator 22 and the internal voltage VREG from the drain of the PMOS transistor PM21 and outputting the internal/external voltage select signal VREGOK. The internal/external voltage select signal generator 231 changes the internal/external voltage select signal VREGOK from its low logic to its high logic according to the order of the generation of the reference voltage VREF and the internal voltage VREG and then latches it.

Referring to FIG. 10, there is shown a detailed circuit diagram of the back bias voltage sensor 24 in FIG. 8. As shown in this drawing, the back bias voltage sensor 24 includes PMOS transistors PM31 and PM32 having sources for inputting the internal voltage VREG from the internal voltage generator 23 in common and drains connected in common, respectively, an NMOS transistor NM31 having a drain connected to the drain of the PMOS transistor PM31, and NMOS transistors NM32 and NM33 connected in series to a source of the NMOS transistor NM31. The PMOS and NMOS transistors PM31 and NM31 have gates connected in common to the ground terminal Vss, respectively. The NMOS transistor NM32 has a gate and a drain connected in common to the source of the NMOS transistor NM31. The NMOS transistor NM33 has a gate and a drain connected in common to a source of the NMOS transistor NM32.

The back bias voltage sensor 24 also includes an inverter I31 having an input terminal connected in common to the drains of the PMOS transistors PM31 and PM32 and an output terminal connected to a gate of the PMOS transistor PM32, an inverter I32 having an input terminal connected to the gate of the PMOS transistor PM32 and the output terminal of the inverter I31, a level shifter 241 having an input terminal connected to an output terminal of the inverter I32, an inverter I35 for inverting the internal/external voltage select signal VREGOK from the internal voltage generator 23, and a transmission gate TR31 having an input terminal connected to an output terminal of the level shifter 241. The transmission gate TR31 is controlled by the internal/external voltage select signal VREGOK from the internal voltage generator 23 and the internal/external voltage select signal VREGOK inverted by the inverter I35.

Further, the back bias voltage sensor 24 includes a PMOS transistor PM36 having a gate for inputting the internal/external voltage select signal VREGOK from the internal voltage generator 23 and a source for inputting the external voltage Vcc, PMOS transistors PM37 and PM38 having sources connected in common to a drain of the PMOS transistor PM36 and drains connected in common, respectively, an NMOS transistor NM37 having a drain connected to the drain of the PMOS transistor PM37, and NMOS transistors NM38 and NM39 connected in series to a source of the NMOS transistor NM37. The PMOS and NMOS transistors PM37 and NM37 have gates connected in common to the ground terminal Vss, respectively. The NMOS transistor NM38 has a gate and a drain connected in common to the source of the NMOS transistor NM37. The NMOS transistor NM39 has a gate and a drain connected in common to a source of the NMOS transistor NM38.

Further, the back bias voltage sensor 24 includes an inverter I33 having an input terminal connected in common to the drains of the PMOS transistors PM37 and PM38 and an output terminal connected to a gate of the PMOS transistor PM38, an inverter I34 having an input terminal connected to the gate of the PMOS transistor PM38 and the output terminal of the inverter I33, and a transmission gate TR32 having an input terminal connected to an output terminal of the inverter I34. The transmission gate TR32 is controlled by the internal/external voltage select signal VREGOK from the internal voltage generator 23 and the internal/external voltage select signal VREGOK inverted by the inverter I35.

Further, the back bias voltage sensor 24 includes an NMOS transistor NM40 having a source for inputting the external voltage Vcc through a PMOS transistor PM42, and an NMOS transistor NM41 having a source connected to the ground terminal Vss, a gate for inputting the external voltage Vcc through the PMOS transistor PM42 and a drain connected in common to a drain of the NMOS transistor NM40 and a source of the NMOS transistor NM39 and for inputting the back bias voltage VBB from the back bias voltage pump 26. The PMOS transistor PM42 acts as a capacitor.

Further, the back bias voltage sensor 24 includes a NAND gate ND31 having one input terminal connected in common to output terminals of the transmission gates TR31 and TR32 and the other input terminal connected to a gate of the NMOS transistor NM40 and for inputting the power-on signal PWRON from the power-on signal generator 21, and an inverter I36 having an input terminal connected to an output terminal of the NAND gate ND31 and an output terminal for outputting the oscillation enable signal OSCEN to the oscillator 25.

Also, the back bias voltage VBB from the back bias voltage pump 26 is applied to a source of the NMOS transistor NM33.

The inverter I31 includes PMOS and NMOS transistors PM33 and NM34 connected in series between the source of the PMOS transistor PM32 and the ground terminal Vss. The PMOS and NMOS transistors PM33 and NM34 have gates connected in common to the drain of the PMOS transistor PM32.

The inverter I32 includes PMOS and NMOS transistors PM34 and NM35 connected in series between the source of the PMOS transistor PM32 and the ground terminal Vss. The PMOS and NMOS transistors PM34 and NM35 have gates connected in common to the output terminal of the inverter I31.

The inverter I33 includes PMOS and NMOS transistors PM39 and NM42 connected in series between the source of the PMOS transistor PM38 and the ground terminal Vss. The PMOS and NMOS transistors PM39 and NM42 have gates connected in common to the drain of the PMOS transistor PM38.

The inverter I34 includes PMOS and NMOS transistors PM40 and NM43 connected in series between the source of the PMOS transistor PM38 and the ground terminal Vss. The PMOS and NMOS transistors PM40 and NM43 have gates connected in common to the output terminal of the inverter I33.

The transmission gate TR31 includes an NMOS transistor NM36 having a gate for inputting the internal/external voltage select signal VREGOK from the internal voltage generator 23, and a PMOS transistor PM35 having a gate for inputting the internal/external voltage select signal VREGOK inverted by the inverter I35.

The transmission gate TR32 includes a PMOS transistor PM41 having a gate for inputting the internal/external voltage select signal VREGOK from the internal voltage generator 23, and an NMOS transistor NM44 having a gate for inputting the internal/external voltage select signal VREGOK inverted by the inverter I35.

Figure 12:
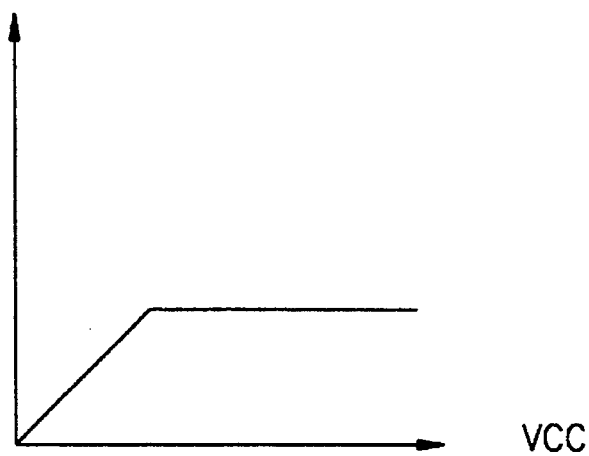
FIG. 12 is a graph illustrating a relationship between an external voltage and an internal voltage in FIG. 8.
Figure 13:
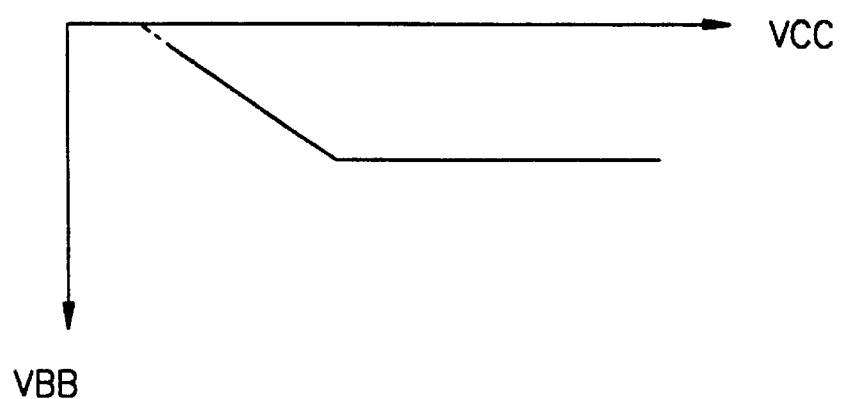
FIG. 13 is a graph illustrating a relationship between the external voltage and a back bias voltage in FIG. 8.

The operation of the back bias voltage generator with the above-mentioned construction in accordance with the present invention will hereinafter be described in detail with reference to FIGS. 11A to 13. FIGS. 11A to 11H are timing diagrams illustrating the operation of the back bias voltage generator in FIG. 8, FIG. 12 is a graph illustrating a relationship between the external voltage Vcc and the internal voltage VREG in FIG. 8 and FIG. 13 is a graph illustrating a relationship between the external voltage Vcc and the back bias voltage VBB in FIG. 8.

First, when the external voltage Vcc is set up to the constant level as shown in FIG. 11A, the power-on signal PWRON from the power-on signal generator 21 goes high in logic as shown in FIG. 11B. The high power-on signal PWRON from the power-on signal generator 21 is applied to the reference voltage generator 22 and the back bias voltage sensor 24.

On the other hand, in the case where the power-on signal PWRON from the power-on signal generator 21 is low in logic, the reference voltage VREF from the reference voltage generator 22 is low in logic as shown in FIG. 11F and the enable signal VBBOKB from the oscillator 25 is high in logic as shown in FIG. 11E. The low reference voltage VREF from the reference voltage generator 22 and the high enable signal VBBOKB from the oscillator 25 are applied to the internal voltage generator 23. As a result, the internal voltage VREG and the internal/external voltage select signal VREGOK from the internal voltage generator 23 become low as shown in FIGS. 11G and 11H, respectively. Then, the low internal voltage VREG and the low internal/external voltage select signal VREGOK from the internal voltage generator 23 are applied to the back bias voltage sensor 24.

In the back bias voltage sensor 24, the low power-on signal PWRON from the power-on signal generator 21 is applied to the NAND gate ND31 and the gate of the NMOS transistor NM40. As a result, the NAND gate ND31 outputs a high logic signal to the inverter I36 regardless of the state of the external voltage Vcc, thereby causing the oscillation enable signal OSCEN which is outputted from the inverter I36 to the oscillator 25 to become low in logic as shown in FIG. 11C. Also, the NMOS transistor NM40 is turned off. As a result, the external voltage Vcc through the PMOS transistor PM42 is not transferred to the NMOS transistor NM40 but to the gate of the NMOS transistor NM41, thereby causing the NMOS transistor NM41 to be turned on. In result, the back bias voltage VBB becomes a ground level Vss as shown in FIG. 11D.

Subsequently, the oscillator 25 outputs no oscillating signal to the back bias voltage pump 26 in response to the low oscillation enable signal OSCEN from the back bias voltage sensor 24 regardless of the states of the internal voltage VREG and the internal/external voltage select signal VREGOK from the internal voltage generator 23. As a result, the back bias voltage pump 26 remains at its stop state.

When the power-on signal PWRON from the power-on signal generator 21 goes high in logic under the condition that the oscillation enable signal OSCEN from the back bias voltage sensor 2, the reference voltage VREF from the reference voltage generator 22 and the internal voltage VREG and the internal/external voltage select signal VREGOK from the internal voltage generator 23 are all low in logic, the reference voltage VREF from the reference voltage generator 22 goes high in logic as shown in FIG. 11F. The high reference voltage VREF from the reference voltage generator 22 is supplied to the internal voltage generator 23.

At this time, because the enable signal VBBOKB from the oscillator 25 still remains at its high state as shown in FIG. 11E, the internal voltage VREG and the internal/external voltage select signal VREGOK from the internal voltage generator 23 remain at their low states as shown in FIGS. 11G and 11H, respectively. The high power-on signal PWRON from the power-on signal generator 21 and the low internal voltage VREG and the low internal/external voltage select signal VREGOK from the internal voltage generator 23 are applied to the back bias voltage sensor 24.

Then, in the back bias voltage sensor 24, the high power-on signal PWRON from the power-on signal generator 21 is applied to the NAND gate ND31 and the gate of the NMOS transistor NM40, the low internal voltage VREG from the internal voltage generator 23 is applied to the sources of the PMOS transistors PM31 and PM32, a source of the PMOS transistor PM33 in the inverter I31 and a source of the PMOS transistor PM34 in the inverter I32, and the low internal/external voltage select signal VREGOK from the internal voltage generator 23 is applied directly to the transmission gates TR31 and TR32 and through the inverter I35 to the transmission gates TR31 and TR32.

As a result, the NMOS transistor NM40 is turned on, thereby causing a voltage at a node B in FIG. 10 to become the state of the back bias voltage VBB or the ground level Vss, resulting in the NMOS transistor NM41 being turned off. After being released from the ground level Vss, the back bias voltage VBB is supplied to the gate of the NMOS transistor NM41 through the NMOS transistor NM40.

At this time, because the NMOS transistors NM37–NM39 remain at their OFF states, the input terminal of the inverter I33 becomes high in logic and the output signal from the inverter I34 goes high in logic. Namely, the low internal/external voltage select signal VREGOK from the internal voltage generator 23 is applied to the gate of the PMOS transistor PM36, thereby causing the PMOS transistor PM36 to be turned on. As being turned on, the PMOS transistor PM36 transfers the external voltage Vcc to the source of the PMOS transistor PM37 whose the gate is connected to the ground terminal Vss. As a result, the PMOS transistor PM37 supplies a high logic signal to the input terminal of the inverter I33.

In the transmission gate TR32, the PMOS transistor PM41 is turned on in response to the low internal/external voltage select signal VREGOK from the internal voltage generator 23 and the NMOS transistor NM44 is turned on in response to the high internal/external voltage select signal VREGOK inverted by the inverter I35. On the contrary, in the transmission gate TR31, the NMOS transistor NM36 is turned off in response to the low internal/external voltage select signal VREGOK from the internal voltage generator 23 and the PMOS transistor PM35 is turned off in response to the high internal/external voltage select signal VREGOK inverted by the inverter I35.

The high output signal from the inverter I34 is transferred to the NAND gate ND31 because the transmission gate TR32 is turned on whereas the transmission gate TR31 is turned off.

Upon receiving the high output signal from the inverter I34 transferred by the transmission gate TR32 and the high power-on signal PWRON from the power-on signal generator 21, the NAND gate ND31 outputs a low logic signal to the inverter I36. As a result, the oscillation enable signal OSCEN from the inverter I36 goes high in logic as shown in FIG. 11C. The high oscillation enable signal OSCEN from the inverter I36 is supplied to the oscillator 25.

Then, the oscillator 25 generates the oscillating signal at the desired period in response to the high oscillation enable signal OSCEN from the back bias voltage sensor 24 and outputs the generated oscillating signal to the back bias voltage pump 26. Upon receiving the oscillating signal from the oscillator 25, the back bias voltage pump 26 performs a negative (−) pumping operation for the back bias voltage VBB, thereby causing the back bias voltage VBB to be gradually lowered in level as shown in FIG. 11D. Then, the bias voltage pump 26 outputs the resultant back bias voltage VBB to the external circuit and the back bias voltage sensor 24.

In result, at the initial state that the external voltage Vcc is supplied, the back bias voltage VBB is merely dependent on the external voltage Vcc since the internal voltage VREG from the internal voltage generator 23 is not passed through the turned-off transmission gate TR31.

Thereafter, at the moment that the back bias voltage VBB is lowered to $-3V_T$, the NMOS transistors NM37–NM39 are turned on, thereby causing the input terminal of the inverter I33 to go low in logic and the output signal from the inverter I34 to become low in logic. Also, the NMOS transistors NM31–NM33 are turned on. As a result, the input terminal of the inverter I31 goes low in logic and the output signal from the inverter I32 becomes low in logic.

The low output signal from the inverter I34 is transferred to the NAND gate ND31 because the transmission gate TR32 remains at its ON state whereas the transmission gate TR31 remains at its OFF state.

The NAND gate ND31 outputs a high logic signal to the inverter I36 because it inputs the low output signal from the inverter I34 transferred by the transmission gate TR32 and the high power-on signal PWRON from the power-on signal generator 21. As a result, the oscillation enable signal OSCEN from the inverter I36 goes from high to low in logic as shown in FIG. 11C. The low oscillation enable signal OSCEN from the inverter I36 is supplied to the oscillator 25.

Then, the oscillator 25 stops the generation of the oscillating signal in response to the low oscillation enable signal OSCEN from the back bias voltage sensor 24. Because receiving no oscillating signal from the oscillator 25, the back bias voltage pump 26 stops the negative (−) pumping operation for the back bias voltage VBB, thereby causing the back bias voltage VBB to be constant in level as shown in FIG. 11D. Then, the back bias voltage pump 26 outputs the resultant back bias voltage VBB to the external circuit and the back bias voltage sensor 24.

Also, the enable signal VBBOKB from the oscillator 25 goes from high to low in logic as shown in FIG. 11E at the moment that the oscillation enable signal OSCEN from the back bias voltage sensor 24 goes from high to low in logic. The low enable signal VBBOKB from the oscillator 25 is supplied to the internal voltage generator 23.

In the internal voltage generator 23, the operational amplifier OP is operated in response to the low enable signal VBBOKB from the oscillator 25. The reference voltage VREF from the reference voltage generator 22 is applied to the noninverting input terminal (+) of the operational amplifier OP and the internal voltage VREG is divided by the resistors R21 and R22 and then feed back to the inverting input terminal (−) of the operational amplifier OP. As being operated, the operational amplifier OP compares the inputted voltages with each other and outputs a low logic signal to the gate of the PMOS transistor PM21 in accordance with the compared result, thereby causing the PMOS transistor PM21 to be turned on. As a result, the internal voltage VREG from the PMOS transistor PM21 goes high in logic and then remains constant at its high state as shown in FIG. 11G. Also, the internal/external voltage select signal VREGOK from the internal/external voltage select signal generator 231 goes high in logic as shown in FIG. 11H in response to VREF and VREG going high. The high internal voltage VREG and the high internal/external voltage select signal VREGOK from the internal voltage generator 23 are applied to the back bias voltage sensor 24.

Subsequently, in the back bias voltage sensor 24, the transmission gate TR32 is turned off whereas the transmission gate TR31 is turned on in response to the high internal/external voltage select signal VREGOK from the internal voltage generator 23. As a result, the external voltage Vcc is blocked by the turned-off transmission gate TR32, whereas the desired constant internal voltage VREG from the internal voltage generator 23 is supplied to the NAND gate ND31 through the PMOS transistors PM31 and PM32, the inverters I31 and I32, the level shifter 241 and the transmission gate TR31.

The NAND gate ND31 outputs a high logic signal to the inverter I36 because it inputs the high power-on signal PWRON from the power-on signal generator 21 and the low output signal from the transmission gate TR31. As a result, the oscillation enable signal OSCEN from the inverter I36 remains at its low state as shown in FIG. 11C. The low oscillation enable signal OSCEN from the inverter I36 is continuously supplied to the oscillator 25.

Then, the oscillator 25 continues to stop the generation of the oscillating signal in response to the low oscillation enable signal OSCEN from the back bias voltage sensor 24. Because receiving no oscillating signal from the oscillator 25, the back bias voltage pump 26 continues to stop the negative (−) pumping operation for the back bias voltage VBB, thereby causing the back bias voltage VBB to be constant in level as shown in FIG. 11D. Then, the back bias voltage pump 26 outputs the resultant back bias voltage VBB to the external circuit and the back bias voltage sensor 24.

Noticeably, the enable signal VBBOKB from the oscillator 25 cannot become high in logic once it went low in logic. Also, the internal/external voltage select signal VREGOK from the internal voltage generator 23 cannot become low in logic once it went high in logic. In other words, no further high enable signal VBBOKB from the oscillator 25 is supplied to the internal voltage generator 23 and no further low internal/external voltage select signal VREGOK from the internal voltage generator 23 is supplied to the back bias voltage sensor 24.

In result, under the condition that the internal voltage VREG from the internal voltage generator 23 remains at the constant level, the back bias voltage VBB is merely dependent on the internal voltage VREG since the external voltage Vcc is not passed through the turned-off transmission gate TR32.

In other words, as shown in FIG. 12, the internal voltage VREG from the internal voltage generator 23 is increased in level until it reaches the desired constant level, at the initial state that the external voltage Vcc is supplied. In this case, the oscillation enable signal OSCEN from the back bias voltage sensor 24 is generated depending on the external voltage Vcc. Once the internal voltage VREG from the internal voltage generator 23 reached the desired constant level, the oscillation enable signal OSCEN from the back bias voltage sensor 24 is generated depending on the internal voltage VREG because the transfer path of the external voltage Vcc is blocked. Therefore, the back bias voltage VBB remains at the constant level regardless of the variation of the external voltage Vcc as shown in FIG. 13.

As apparent from the above description, according to the present invention, when the internal voltage reaches the desired constant level, the transfer path of the external voltage is blocked and the oscillation enable signal is generated depending on the internal voltage, so that the back bias voltage can remain at the constant level regardless of the variation of the external voltage. Therefore, the back bias voltage generator of the present invention has the effect of preventing integrated circuit components from being damaged due to an instable back bias voltage.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A back bias voltage generator comprising:

power-on signal generation means for generating a power-on signal when an external voltage remains at a constant level;

reference voltage generation means for generating a reference voltage in response to the power-on signal from said power-on signal generation means;

internal voltage generation means for generating an internal voltage and an internal/external voltage select signal in response to the reference voltage from said reference voltage generation means, said internal voltage being constant in level;

back bias voltage sensing means for generating an oscillation enable signal in response to the external voltage or the internal voltage from said internal voltage generation means under control of the internal/external voltage select signal from said internal voltage generation means;

oscillation means for generating an oscillating signal at a desired period and an enable signal in response to the oscillation enable signal from said back bias voltage sensing means and outputting the generated enable signal to said internal voltage generation means; and back bias voltage pumping means for performing a voltage pumping operation in response to the oscillating signal from said oscillation means to generate a desired level of back bias voltage and outputting the generated back bias voltage to an external circuit and said back bias voltage sensing means.

2. A back bias voltage generator as set forth in claim 1, wherein said internal voltage generation means includes:

an operational amplifier being operated in response to the enable signal from said oscillation means to compare the internal voltage with the reference voltage from said reference voltage generation means;

a transistor being operated in response to an output signal from said operational amplifier to output the internal voltage to said back bias voltage sensing means and to feed it back to said operational amplifier; and an internal/external voltage select signal generator for outputting the internal/external voltage select signal to said back bias voltage sensing means in response to the internal voltage from said transistor and the reference voltage from said reference voltage generation means.

3. A back bias voltage generator as set forth in claim 1, wherein said back bias voltage sensing means generates the oscillation enable signal according to the external voltage at an initial state that the external voltage is supplied.

4. A back bias voltage generator as set forth in claim 1, wherein said back bias voltage sensing means generates the oscillation enable signal according to the internal voltage from said internal voltage generation means once the internal voltage reached a desired constant level.

5. A back bias voltage generator as set forth in claim 1, wherein said back bias voltage sensing means maintains the oscillation enable signal at its high state until the back bias voltage from said back bias voltage pumping means is lowered to a desired constant level.

6. A back bias voltage generator as set forth in claim 1, wherein said enable signal cannot become high in logic once the enable signal went low in logic.

7. A back bias voltage generator as set forth in claim 1, wherein said internal/external voltage select signal cannot become low in logic once the internal/external voltage select signal went high in logic.

* * * * *